United States Patent
Maeda et al.

(10) Patent No.: US 7,515,079 B2
(45) Date of Patent: Apr. 7, 2009

(54) METHOD OF CONTROLLING DELTA-SIGMA MODULATOR AND DELTA-SIGMA MODULATOR

(75) Inventors: Tomoaki Maeda, Kyoto (JP); Hisashi Adachi, Osaka (JP); Taiji Akizuki, Miyagi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/896,816

(22) Filed: Sep. 6, 2007

(65) Prior Publication Data

US 2008/0062024 A1 Mar. 13, 2008

(30) Foreign Application Priority Data

Sep. 8, 2006 (JP) ............... P. 2006-244378

(51) Int. Cl.
*H03M 3/00* (2006.01)
(52) U.S. Cl. .................. 341/143; 341/144
(58) Field of Classification Search ........ 341/144, 341/143
See application file for complete search history.

(56) References Cited

U.S. PATENT DOCUMENTS 6,462,687 B1 * 10/2002 Eshraghi et al. ........ 341/143
7,190,296 B2 * 3/2007 Gupta ..................... 341/143
7,212,137 B2 * 5/2007 Melanson ................. 341/77

FOREIGN PATENT DOCUMENTS

| JP | 2002-33666 | 1/2002 |
|---|---|---|
| JP | 2003-060508 | 2/2003 |

* cited by examiner

*Primary Examiner*—Brian Young
(74) *Attorney, Agent, or Firm*—McDermott Will & Emery LLP

(57) ABSTRACT

To provide a method of controlling a delta-sigma modulator and a delta-sigma modulator capable of suppressing a consumption power and also improving a signal-to-noise ratio by implementing both the zero-point shifting technology and the double sampling technology simultaneously, a delta-sigma modulator includes a first integrator (1), a second integrator (2), a third integrator (3), a local feedback (4), delay units (5), a quantizer (6), a DA converter (7), gains (8a to 8c) of the DA converter, gains (9a to 9c) of the integrators, adders (10), no-delay integrators (11) each having a gain "1", a gain (12) of the local feedback, a DAC (13) of a gain "1", a delay unit (5) for delaying output signals of the DA converter (7), and a delay unit (5) for delaying an output signal of the local feedback (4).

4 Claims, 12 Drawing Sheets

| SLP7 | SLP6 | SLP5 | SLP4 | SLP3 | SLP2 | SLP1 | NUMBER OF BITS |
|---|---|---|---|---|---|---|---|
| 1 | 1 | 1 | 0 | 1 | 1 | 1 | 1 |
| 1 | 0 | 1 | 0 | 1 | 0 | 1 | 2 |
| 0 | 0 | 0 | 0 | 0 | 0 | 0 | 3 |

SLP: 0 → QUANTIZER: ON
SLP: 1 → QUANTIZER: OFF

METHOD OF CONTROLLING DELTA-SIGMA MODULATOR AND DELTA-SIGMA MODULATOR

BACKGROUND OF THE INVENTION

1. Field of the Invention

The present invention relates to a delta-sigma modulator and, more particularly, a delta-sigma modulator using a switched capacitor.

2. Description of the Related Art

In the radio communication field, the audio field, and the like, processes such as communication/recording/reproduction, etc. are applied to sound and image information. In the above system, both the analog circuit and the digital circuit are needed. Thus, a function of converting the analog signal to the digital signal (referred to as an "AD converter" hereinafter) is needed, and conversely a function of converting the digital signal to the analog signal is also needed. A delta-sigma modulator is one of effective means in implementing the above functions.

In the delta-sigma modulator, one important characteristic is a signal-to-noise ratio. One approach for improving the signal-to-noise ratio is to increase an in-band attenuation factor of a noise transfer function of a loop filter, and the other approach is to increase a sampling frequency.

As the approach for increasing the in-band attenuation factor of the noise transfer function, the technology to scatter a zero point (called as the "zero-point shifting" hereinafter) is known. Also, as the approach for increasing the sampling frequency, the technology called as the double sampling is known. In order to understand the present invention, the zero-point shifting technology and the double sampling technology are important. Therefore, these two technologies will be discussed briefly hereunder.

First, the zero-point shifting technology will be discussed. Since the order of loop filter is decided by the number of integrators, there is a drawback that normally a consumption current is increased as the order is increased. In order to settle the above problem, the technology set forth in Patent Literature 1 (FIG. 2 and FIG. 3) has been proposed.

In above Literature is disclosed the technology that the signal-to-noise ratio is improved without an increase of the order by scattering a zero point of the noise transfer function on a unit circle in a loop filter of the delta-sigma modulator of two order or more. In order to scattering the zero point, the local feedback that contains two integrators or more out of the cascade-connected integrators and needs no interposition of the quantizer.

Then, the double sampling technology will be discussed. This technology is set forth in Patent Literature 2 (FIG. 5). This technology improves the signal-to-noise ratio without an increase of a consumption power by increasing twice a settling allowable time rather than the prior art. It is obvious that, in case both the zero-point shifting technology and the double sampling technology can be implemented simultaneously, the good signal-to-noise ratio can be attained while suppressing a consumption power.

Patent Literature 1: JP-A-2003-60508 (FIG. 2 and FIG. 3)
Patent Literature 2: JP-A-2002-33666 (FIG. 5)

However, both the zero-point shifting technology and the double sampling technology could not be used at the same time. This problem will be discussed briefly hereunder.

FIG. 10 shows a block diagram of the delta-sigma modulator in the prior art. In FIG. 10, a local feedback (4) is applied between a second integrator (2) and a third integrator (3) without intervention of a quantizer, whereby the zero-point shifting technology is implemented.

In order to implement the transfer function shown in the block diagram of this Figure, an amount of delay of the data among respective blocks must be set equal to the number of delay units (5). For example, since a single delay unit (5) is inserted between an input and an output of the local feedback (4), an amount of delay of the data must be set to one delay.

FIG. 11 shows a timing control chart when the single sampling technology is applied to the delta-sigma modulator in FIG. 10. A clock is given by $\phi 1$ and $\phi 2$, and is a two-phase clock in which a High period and a Low period never overlap with each other. In the case of the single sampling, a time for one delay corresponds to one period of the clock.

A first integrator (1) samples an input analog signal into a sampling capacitance when $\phi 1$ is High and $\phi 2$ is Low, and transfers a charge to an integrating capacitance when $\phi 1$ is Low and $\phi 2$ is High.

The second integrator (2) transfers the input analog signal to the integrating capacitance when $\phi 2$ is High and $\phi 1$ is Low, and discharges a charge of the sampling capacitance when $\phi 2$ is Low and $\phi 1$ is High. The third integrator (3) samples and transfers the charge at the same timing as the first integrator (1).

The local feedback (4) samples and transfers the charge at the same timing as the second integrator (2). A quantizer (6) operates in a compare mode when $\phi 1$ is High and $\phi 2$ is Low, and operates in a reset mode when $\phi 1$ is Low and $\phi 2$ is High.

A DAC 1 (8a) samples and transfers the charge at the same timing as the first integrator (1). A DAC 2 (8b) transfers the charge to the integrating capacitance when $\phi 1$ is High and $\phi 2$ is Low, and discharges the charge of the sampling capacitance when $\phi 1$ is Low and $\phi 2$ is High. A DAC 3 (8c) samples and transfers the charge at the same timing as the first integrator (1).

In FIG. 11, a data transfer timing in each block will be considered by defining the data being transferred at the first integrator (1) at a certain timing as $V1(n)$. In a next time period, the data $V1(n)$ is transferred to the second integrator (2) and the third integrator (3). Then, in the one after the next time period, the data are transferred to the local feedback (4), the quantizer (6), the DAC 1 (8a), the DAC 2 (8b), and the DAC 3 (8c) and simultaneously an output signal of the local feedback (4) goes back to the second integrator (2).

Therefore, an amount of delay of data between the input and the output of the local feedback (4) is one delay, whereby the transfer function given by the block diagram in FIG. 10 is realized. This indicates that the signal-to-noise ratio can be improved by implementing the zero-point shifting technology.

Next, the case where the double sampling technology is applied will be considered hereunder. FIG. 12 shows a timing control chart when the double sampling technology is applied to the delta-sigma modulator in FIG. 10. In the case of the double sampling, a time for one delay corresponds to a half period of the clock.

In the double sampling, in the half period of the clock, some data is sampled (corresponding to a system A in FIG. 12) and preceding data is transferred (corresponding to a system B in FIG. 12). A data transferring timing of each block in the system A is similar to that of the single sampling, and a data transferring timing in the system B is opposite to that of the single sampling.

In FIG. 12, like the case of the single sampling, the data transferring timing in each block will be considered by defining the data being transferred the first integrator (1) at a certain timing as $V1(n)$.

In a next half time period, the data V1(n) sampled in the system A are transferred to the second integrator (2) in the system B. Then, in the half after the next half time period, the data are transferred to the third integrator (3). Then, in the subsequent half time period, the data are transferred to the local feedback (4) and simultaneously an output signal of the local feedback (4) goes back to the second integrator (2). Now, explanation concerning the data of the quantizer (6), the DAC 1 (8a), the DAC 2 (8b), and the DAC 3 (8c) will be omitted herein.

As apparent from the above, when the double sampling technology is applied to the delta-sigma modulator shown in FIG. 10, an amount of delay of data between the input and the output of the local feedback (4) is two delays, whereby the transfer function given by the block diagram in FIG. 10 is not realized. This indicates that the zero-point shifting technology and the double sampling technology cannot be used simultaneously.

SUMMARY OF THE INVENTION

The present invention has been made in view of the above circumstances in the prior art, and it is an object of the present invention to provide a method of controlling a delta-sigma modulator and a delta-sigma modulator capable of suppressing a consumption power and also improving a signal-to-noise ratio by implementing both the zero-point shifting technology and the double sampling technology simultaneously.

A method of controlling a delta-sigma modulator of the present invention that includes integrators cascade-connected at a plurality of stages, a quantizer for quantizing an output signal of the integrator at a last stage, a DA converter for returning an output signal of the quantizer to inputs of the integrators at a plurality of stages, and a local feedback means that contains two integrators or more out of the integrators at the plurality of stages and needs no interposition of the quantizer, includes delaying output signals of the DA converter by a half period of a clock; and delaying an output signal of the local feedback means by the half period of the clock, whereby a delta-sigma modulation is performed at timings of a double sampling.

According to the method of controlling a delta-sigma modulator of the present invention, an amount of delay of the data between the input and the output of the local feedback means is set to one delay. Therefore, since both the zero-point shifting technology and the double sampling technology can be implemented simultaneously, a consumption power can be suppressed and also a signal-to-noise ratio can be improved.

Also, a delta-sigma modulator of the present invention including integrators cascade-connected at a plurality of stages, a quantizer for quantizing an output signal of the integrator at a last stage, a DA converter for returning an output signal of the quantizer to inputs of the integrators at a plurality of stages, and a local feedback means that contains two integrators or more out of the integrators at the plurality of stages and needs no interposition of the quantizer, includes a first delay unit for delaying output signals of the DA converter by a half period of a clock; and a second delay unit for delaying an output signal of the local feedback means by the half period of the clock; wherein the delta-sigma modulator operates at timings of a double sampling.

According to the method of controlling a delta-sigma modulator of the present invention, an amount of delay of the data between the input and the output of the local feedback means is set to one delay. Therefore, since both the zero-point shifting technology and the double sampling technology can be implemented simultaneously, the consumption power can be suppressed and also the signal-to-noise ratio can be improved.

Also, in the delta-sigma modulator of the present invention, the integrators at a plurality of stages are constructed by cascade-connecting first to third integrators, the first integrator includes a third delay unit for delaying the input signal by the half period of the clock, and a first adder for subtracting the output signals of the DA converter from an output signal of the third delay unit, the second integrator includes a fourth delay unit for delaying an output signal of the first integrator by the half period of the clock, and a second adder for subtracting the output signals of the DA converter and an output signal of the local feedback means from an output signal of the fourth delay unit, and the third integrator includes a third adder for subtracting the output signals of the DA converter from an output signal of the second integrator.

Also, the delta-sigma modulator of the present invention further includes a controlling unit for turning ON/OFF a function of the third integrator.

Also, the delta-sigma modulator of the present invention further includes a controlling unit for turning ON/OFF a function of the local feedback means.

Also, the delta-sigma modulator of the present invention further includes a controlling unit for switching a number of bits of the quantizer.

According to the present invention, both the zero-point shifting technology and the double sampling technology can be implemented simultaneously. Therefore, the consumption power can be suppressed and also the signal-to-noise ratio can be improved.

Also, one AD converter can handle a plurality of signal bands.

DESCRIPTION OF THE PREFERRED EMBODIMENTS

Figure 1:
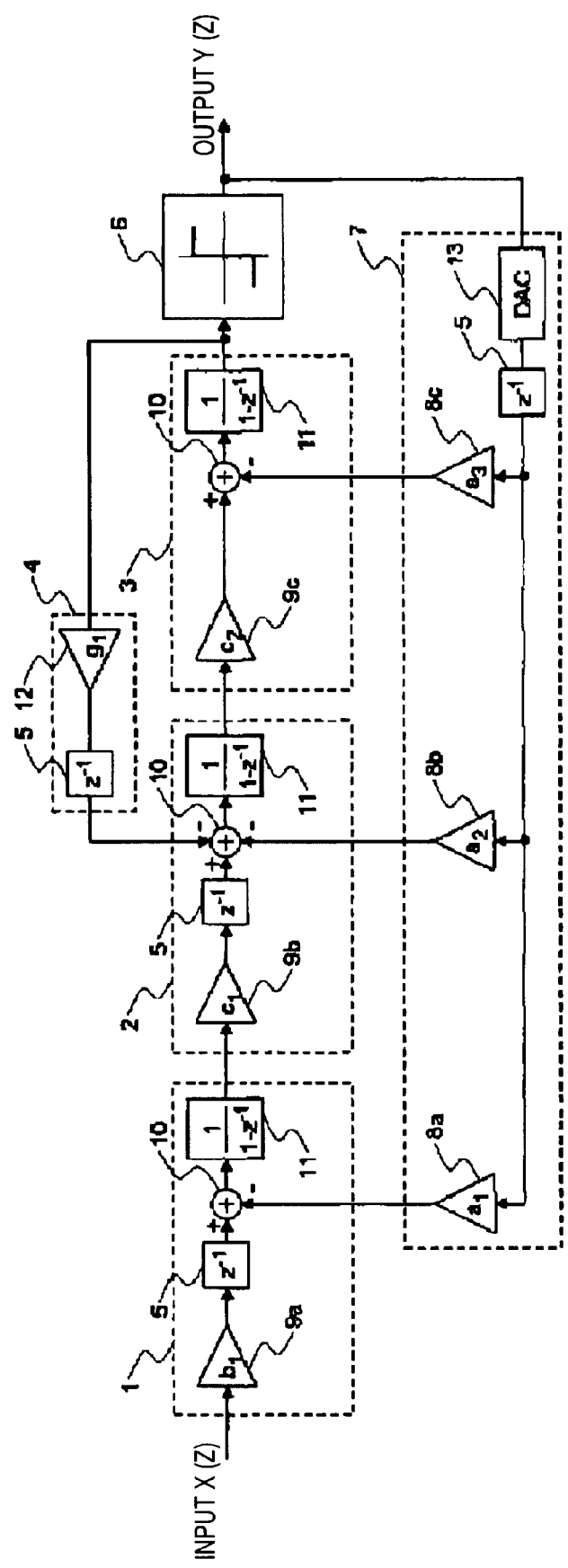
FIG. 1 is a block diagram of a delta-sigma modulator according to a first embodiment of the present invention.

FIG. 1 is a block diagram of a delta-sigma modulator according to a first embodiment of the present invention. In FIG. 1, the delta-sigma modulator according to the first embodiment of the present invention includes the first integrator (1), the second integrator (2), the third integrator (3), the local feedback (4), the delay units (5), the quantizer (6), a DA converter (7), gains (8a to 8c) of the DA converter (7), gains (9a to 9c) of the integrators (1 to 3), adders (10), no-delay integrators (11) each having a gain "1", a gain (12) of the local feedback (4), a DAC (13) of a gain "1", the delay unit (5) for delaying output signals of the DA converter (7), and the delay unit (5) for delaying an output signal of the local feedback (4).

The first integrator (1), the second integrator (2), and the third integrator (3) are cascade-connected. The quantizer (6) quantizes an output signal of the third integrator (3) at the last stage. The DA converter (7) causes the delay unit (5) to delay an output signal of the quantizer (6), and returns the signal to inputs of respective integrators (1 to 3). The local feedback (4) constitutes a feedback circuit that contains the second integrator (2) and the third integrator (3) but does not contain the quantizer (6), and causes the delay unit (5) to delay an output signal of the third integrator (3) and returns the signal to an input of the second integrator (2).

Figure 2:
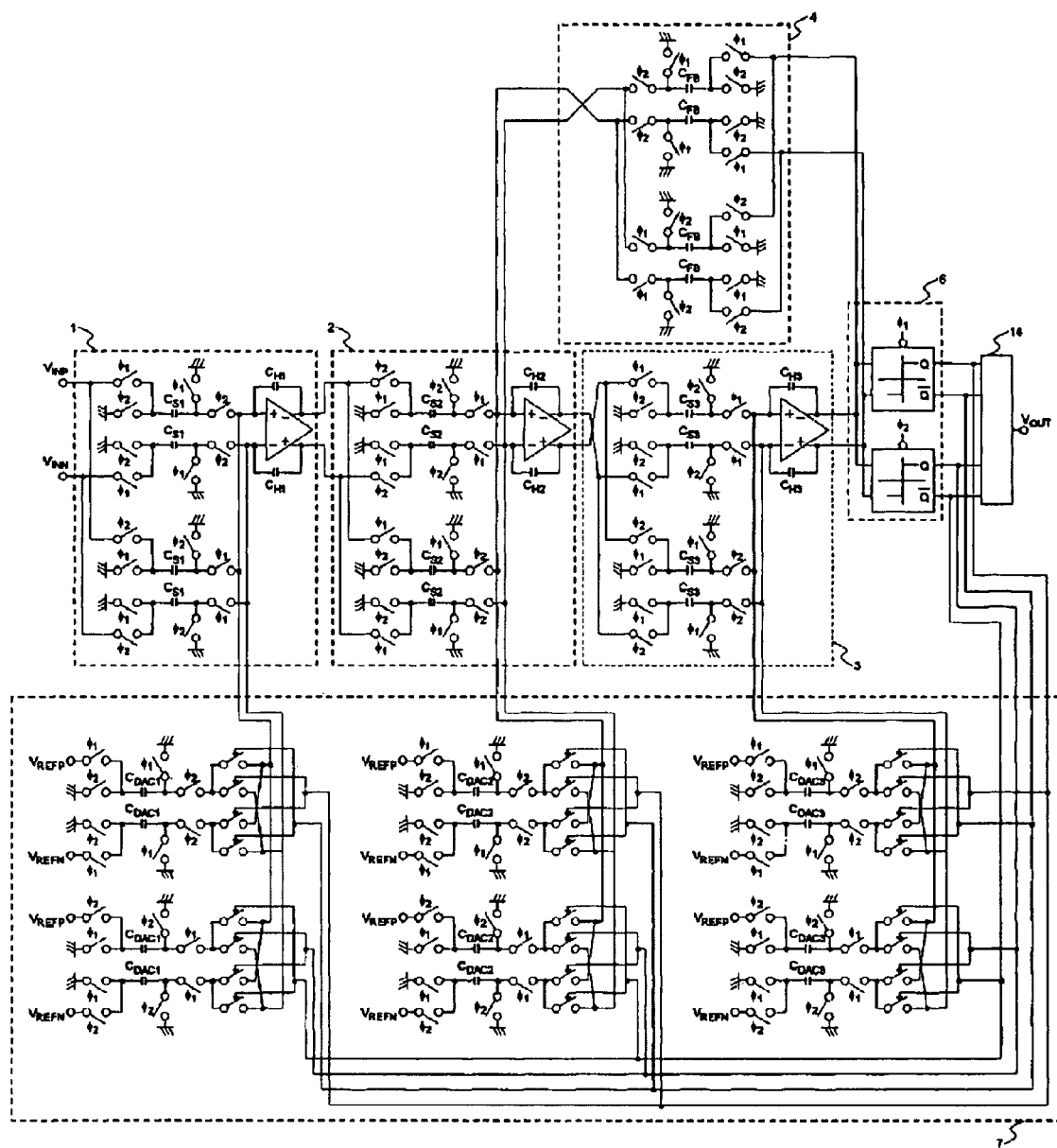
FIG. 2 is a circuit diagram of the delta-sigma modulator according to the first embodiment of the present invention.

FIG. 2 is a circuit diagram of the delta-sigma modulator according to the first embodiment of the present invention. The same reference symbols are affixed to the same portions as those in FIG. 1, and their explanation will be omitted herein. As shown in FIG. 2, the delta-sigma modulator according to the first embodiment of the present invention includes analog input terminals (VINP, VINN), sampling capacitances (CS1 to CS3), integrating capacitances (CH1 to CH3), a digital output terminal (VOUT), reference voltages (VREFP, VREFN) of the DA converter, and an output circuit for synthesizing timings of the double sampling.

Figure 3:
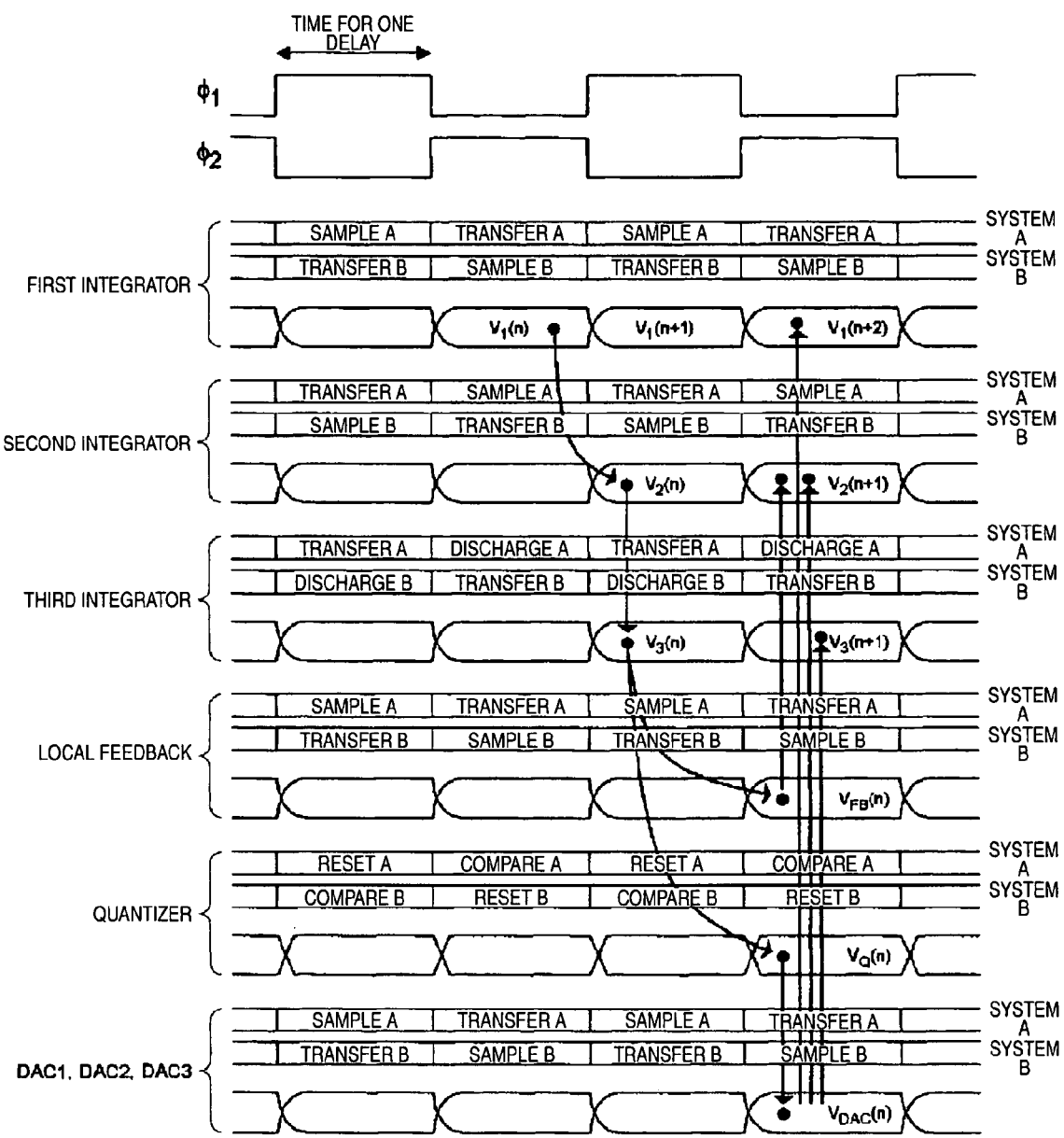
FIG. 3 is a timing control chart of the delta-sigma modulator according to the first embodiment of the present invention.

FIG. 3 shows a timing control chart of the delta-sigma modulator according to the first embodiment of the present invention. A clock is given by $\phi 1$ and $\phi 2$, and is a two-phase clock in which a High period and a Low period never overlap with each other.

Since the sampling method according to the first embodiment of the present invention is the double sampling, a time for one delay corresponds to a half period of the clock. In the double sampling, in a half period of the clock, some data are sampled (corresponding to a system A in FIG. 3) and simultaneously preceding data are transferred (corresponding to a system B in FIG. 3).

Then, a data transferring timing in each block in the system A will be discussed hereunder. The first integrator (1) samples an input analog signal in the sampling capacitance (CS1) when $\phi 1$ is High and $\phi 2$ is Low, and transfers the charge to the integrating capacitance (CH1) when $\phi 1$ is Low and $\phi 2$ is High.

The second integrator (2) samples an input analog signal into the sampling capacitance (CS2) when $\phi 2$ is High and $\phi 1$ is Low, and transfers the charge to the integrating capacitance (CH2) when $\phi 2$ is Low and $\phi 1$ is High.

The third integrator (3) transfers an input analog signal to the integrating capacitance (CH3) when $\phi 1$ is High and $\phi 2$ is Low, and discharges the charge in the sampling capacitance (CS3) when $\phi 1$ is Low and $\phi 2$ is High.

The local feedback (4) samples and transfers the charge at the same timing as the first integrator (1). The quantizer (6) operates in a reset mode when $\phi 1$ is High and $\phi 2$ is Low, and operates in a decision mode when $\phi 1$ is Low and $\phi 2$ is High.

The DAC 1 (8a), the DAC 2 (8b), and the DAC 3 (8c) sample and transfer the charge at the same timing as the first integrator (1). Here, the data transferring timing of each block in the system B is opposite to that of the single sampling in the system A.

In FIG. 3, the data transfer timing in each block will be considered by defining the data being transferred from the first integrator (1) at a certain timing as V1(n). In a next half time period, the data V1(n) are transferred to the second integrator (2) and the third integrator (3). Then, in the half after the next half time period, the data are transferred to the local feedback (4), the quantizer (6), the DAC 1 (8a), the DAC 2 (8b), and the DAC 3 (8c) and simultaneously an output signal of the local feedback (4) goes back to the second integrator (2).

Figure 10:
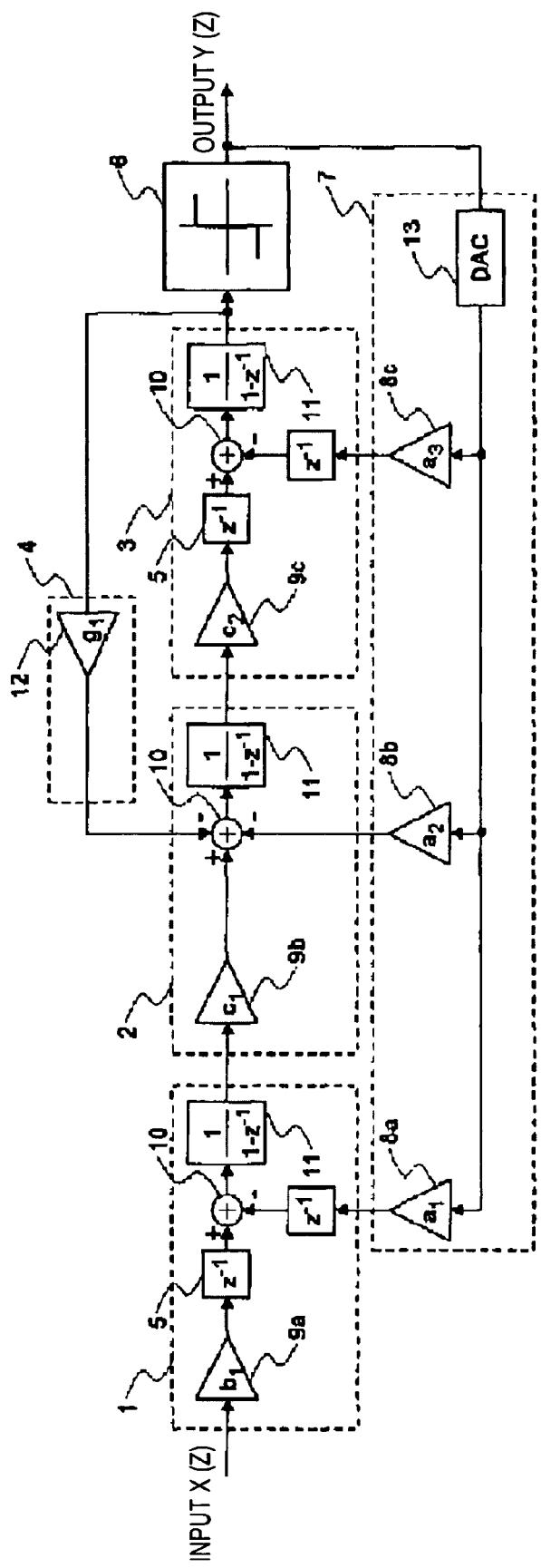
FIG. 10 is a block diagram of a delta-sigma modulator in the prior art.
Figure 11:
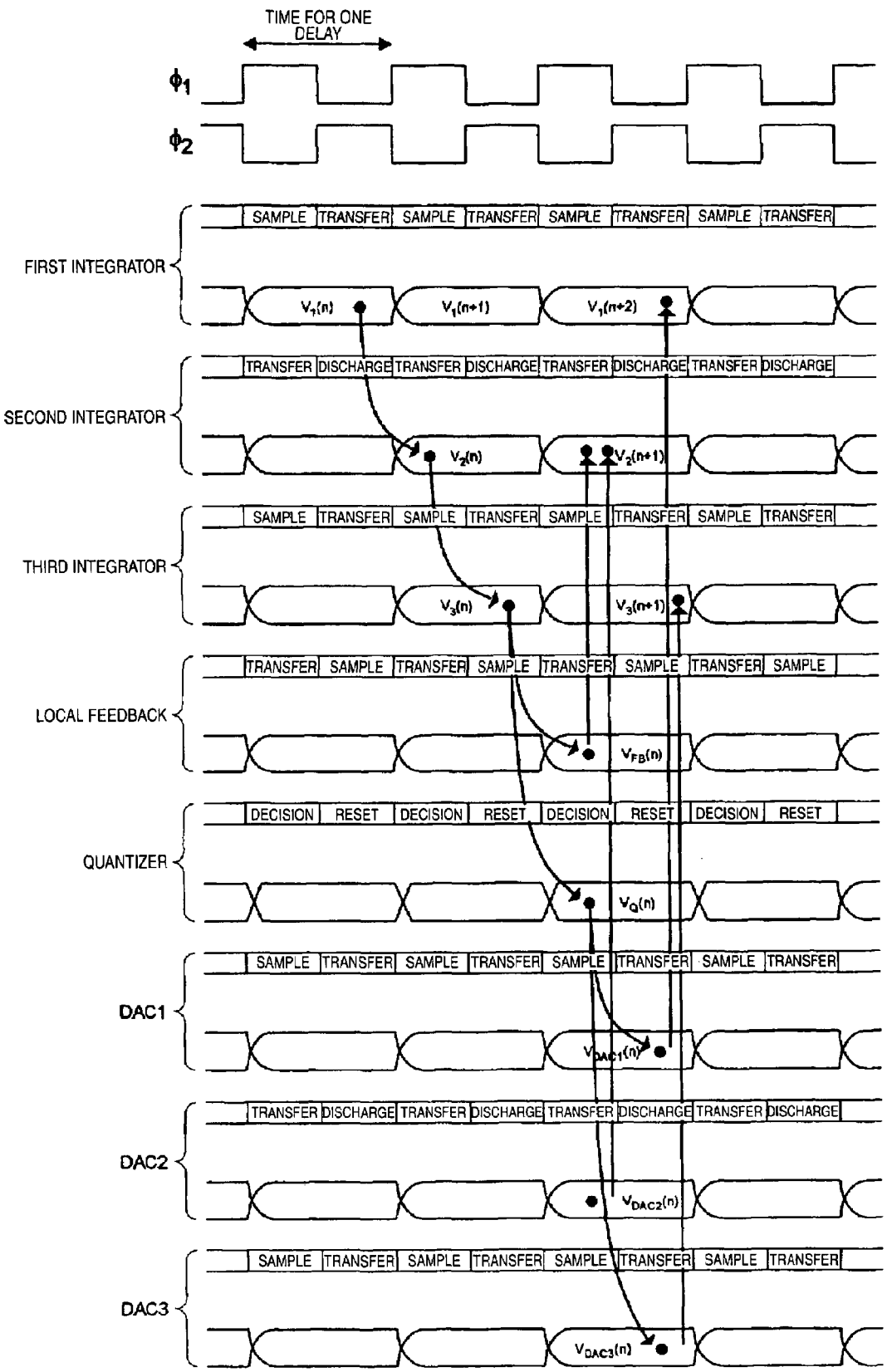
FIG. 11 is a timing control chart when the single sampling technology is applied to the delta-sigma modulator in the prior art.
Figure 12:
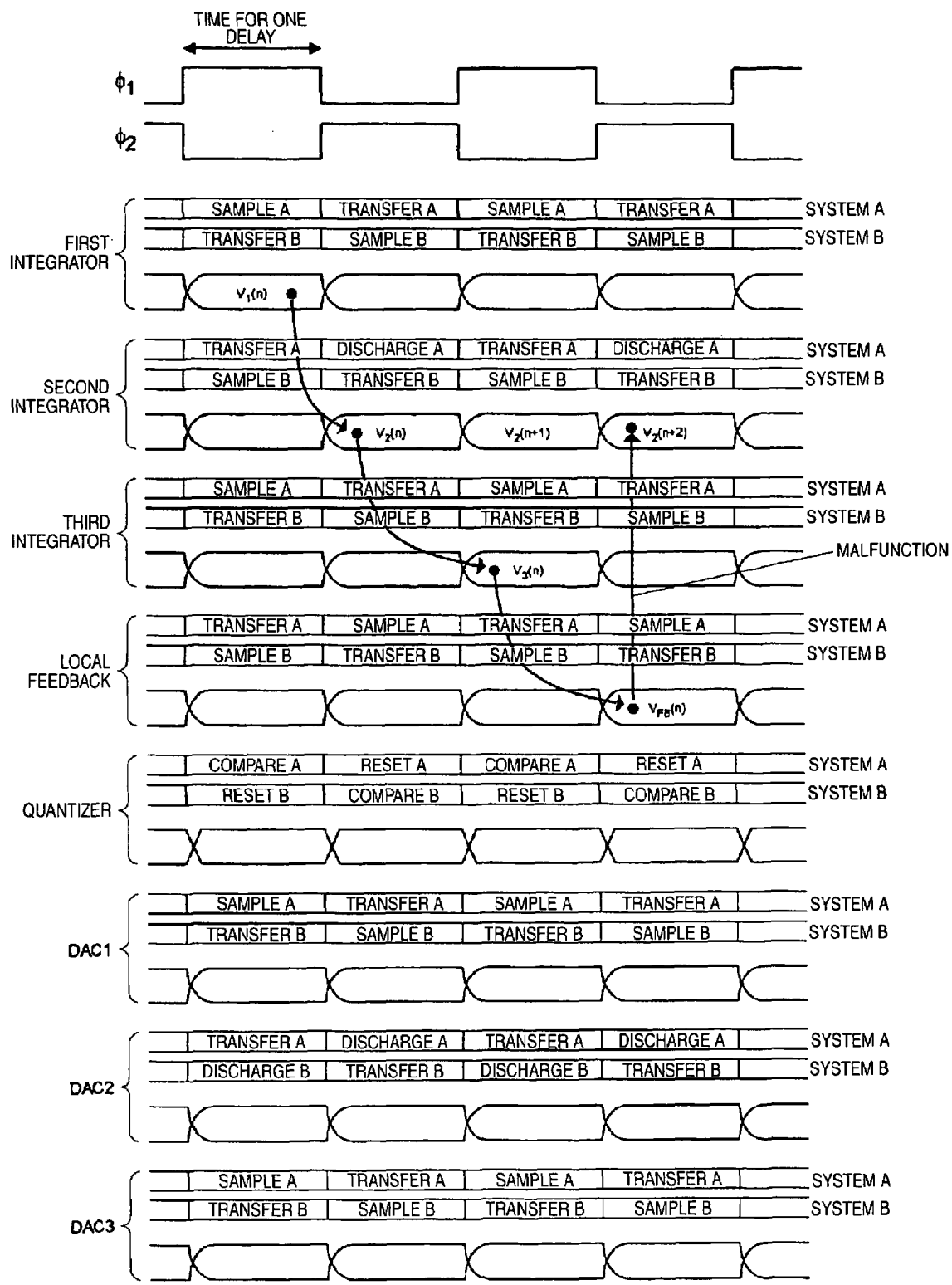
FIG. 12 is a timing control chart when the double sampling technology is applied to the delta-sigma modulator in the prior art.

Therefore, an amount of delay of the data between the input and the output of the local feedback (4) is one delay, whereby the transfer function given by the block diagram in FIG. 10 is realized. This indicates that, because the zero-point shifting technology and the double sampling technology are implemented simultaneously, a consumption power can be suppressed and also the signal-to-noise ratio can be improved.

Meanwhile, since many communication standards are present particularly in the radio communication field, one AD converter must deal with a plurality of signal bands. As a result, normally the AD converter must be prepared as many as the number of signal bands. In this event, such a problem existed that a consumption power is increased and an increase of an area is caused.

Next, a delta-sigma modulator capable of solving the problem in the prior art and capable of handling a plurality of signal bands by one AD converter will be explained hereunder.

Figure 4:
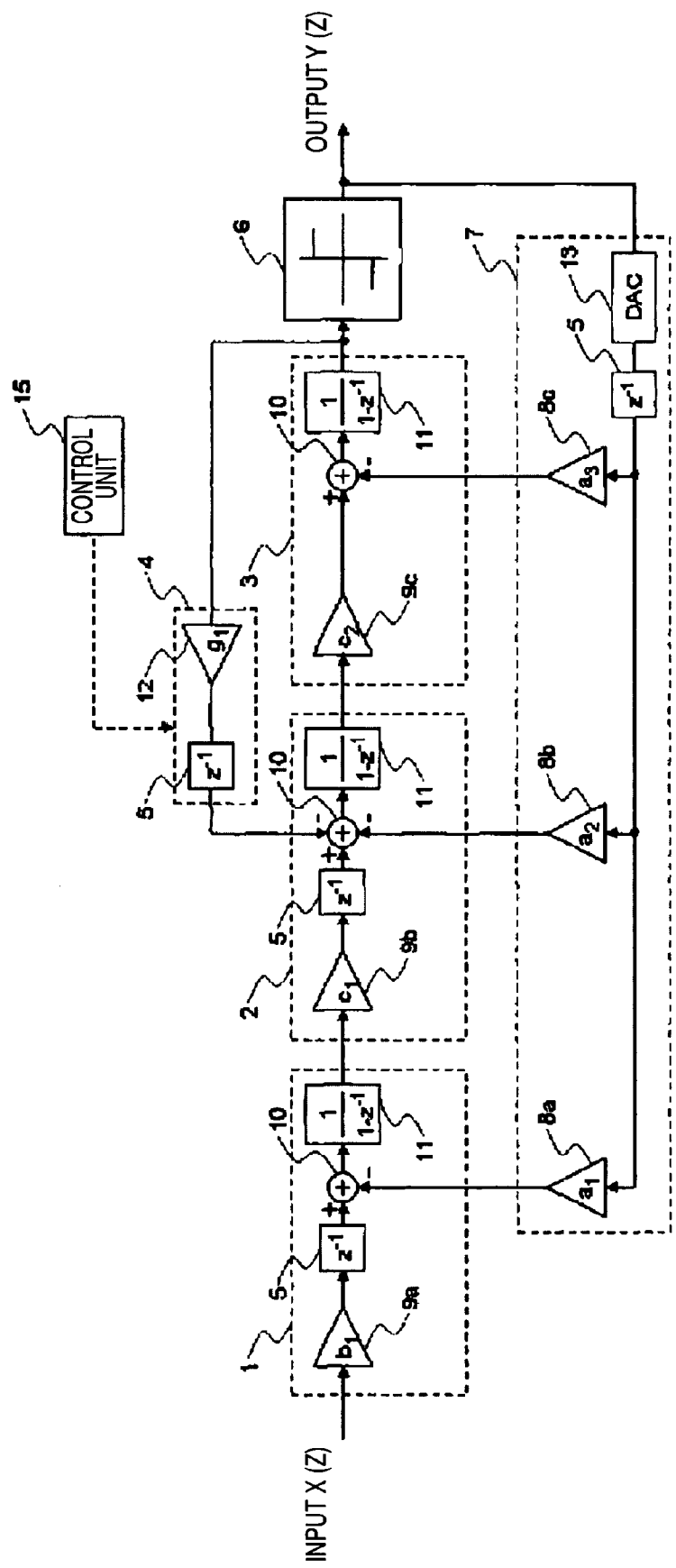
FIG. 4 is a block diagram of a delta-sigma modulator according to a second embodiment of the present invention.

FIG. 4 is a block diagram of a delta-sigma modulator according to a second embodiment of the present invention. In FIG. 4, the delta-sigma modulator according to the second embodiment of the present invention has a control unit 15 for turning ON/OFF of the local feedback (4), in addition to the configuration of the delta-sigma modulator according to the first embodiment of the present invention.

Because the function of the local feedback (4) is turned ON/OFF by the control unit 15, the noise transfer function can be changed easily. Thus, the delta-sigma modulator can deal with a plurality of signal bands.

Figure 5:
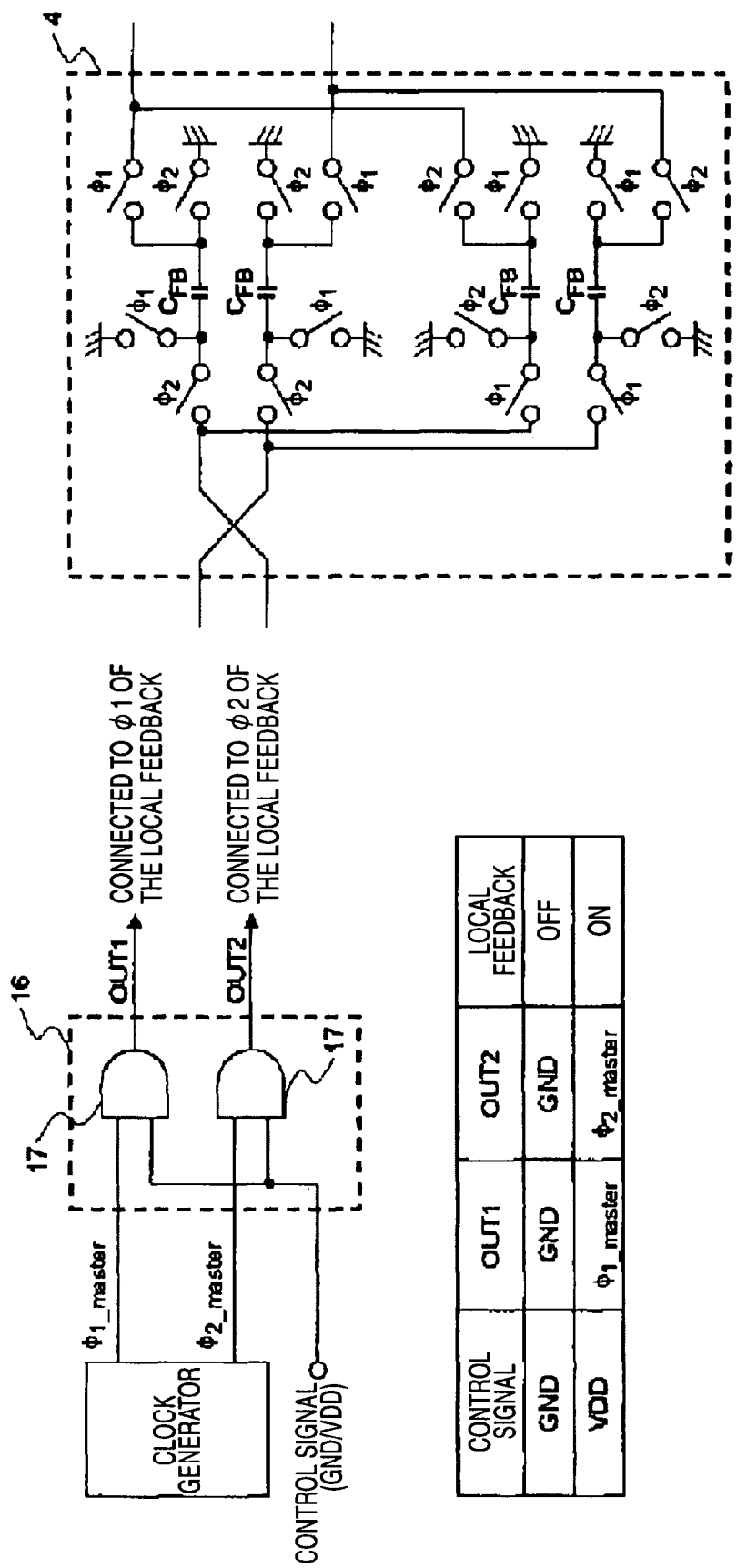
FIG. 5 is a view showing concretely a means for controlling ON/OFF of a local feedback according to the second embodiment of the present invention.

FIG. 5 shows concretely a means for controlling ON/OFF of the local feedback (4) according to the second embodiment of the present invention. In FIG. 5, a means (16) for controlling ON/OFF of the local feedback (4) according to the second embodiment of the present invention has two AND gates 17, and an OUT1 terminal is connected to $\phi 1$ of the local feedback (4) and an OUT2 terminal is connected to $\phi 2$ of the local feedback (4).

In FIG. 5, only the local feedback (4) is extracted from FIG. 2 and shown. The switch has such a nature that this switch is turned OFF when a ground potential (GND) is applied, and this switch is turned ON when a power supply voltage (VDD) is applied. The above switch is implemented easily by using a MOSFET on the semiconductor integrated circuit.

In FIG. 5, either the ground potential (GND) or the power supply voltage (VDD) is applied to a control signal terminal. When the ground potential (GND) is applied, both the OUT1 terminal and the OUT2 terminal are set to a ground potential (GND) and thus all switches are turned OFF. That is, the local feedback (4) is brought into its OFF state. Conversely, when the power supply voltage (VDD) is applied, an output φ1_master of a clock generator is output to the OUT1 terminal, and an output φ2_master of a clock generator is output to the OUT2 terminal. That is, the local feedback (4) is brought into its ON state.

Figure 6:
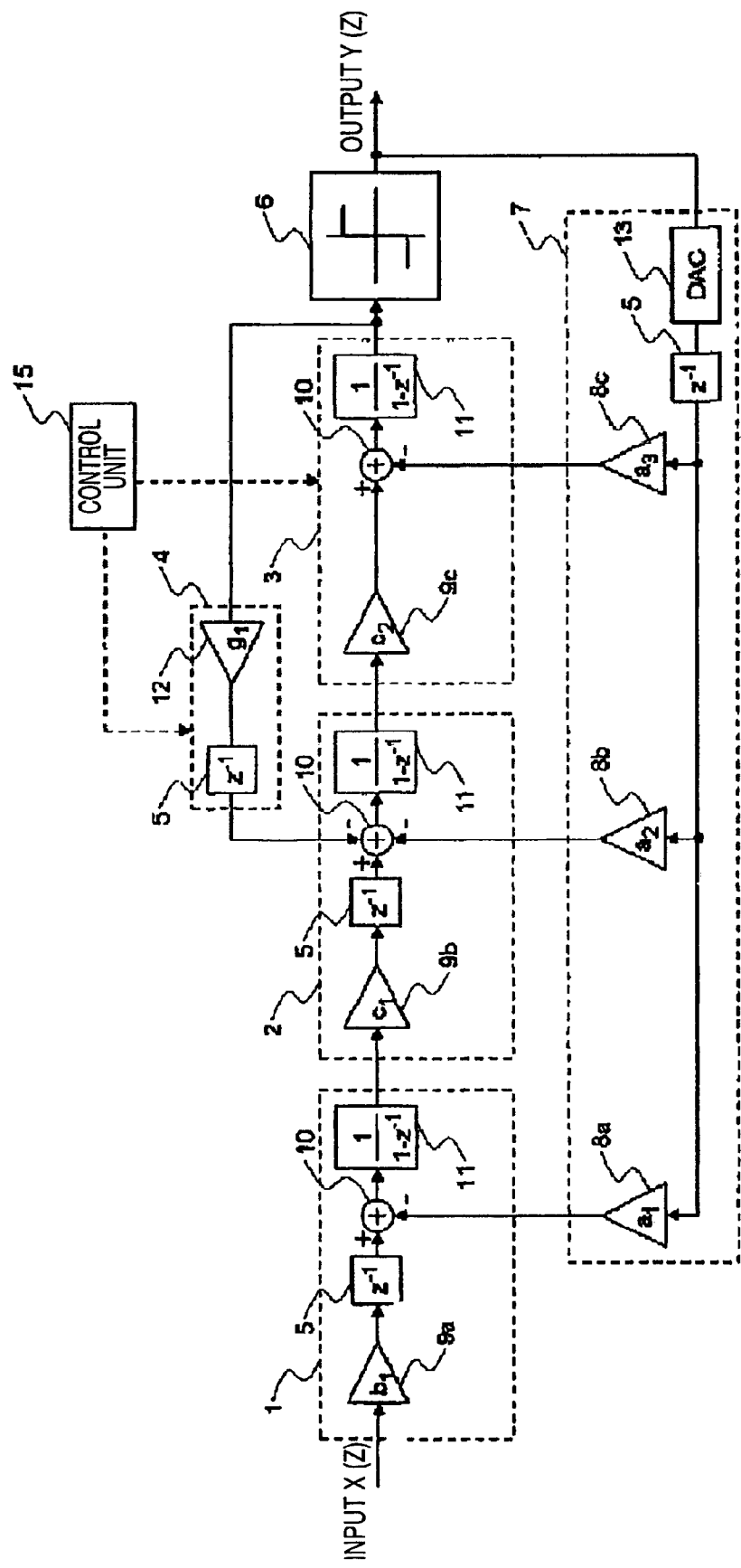
FIG. 6 is a block diagram of a delta-sigma modulator according to a third embodiment of the present invention.

FIG. 6 is a block diagram of a delta-sigma modulator according to a third embodiment of the present invention. In FIG. 6, the delta-sigma modulator according to the third embodiment of the present invention has the control unit (15) for turning ON/OFF a function of the third integrator (3), in addition to the configuration of the delta-sigma modulator according to the second embodiment of the present invention. Normally, the order of the noise transfer function may be set low when the signal band is narrow. According to the delta-sigma modulator shown in FIG. 6, the order can be set low by turning OFF the function of the third integrator (3), so that a consumption power can be suppressed.

Figure 7:
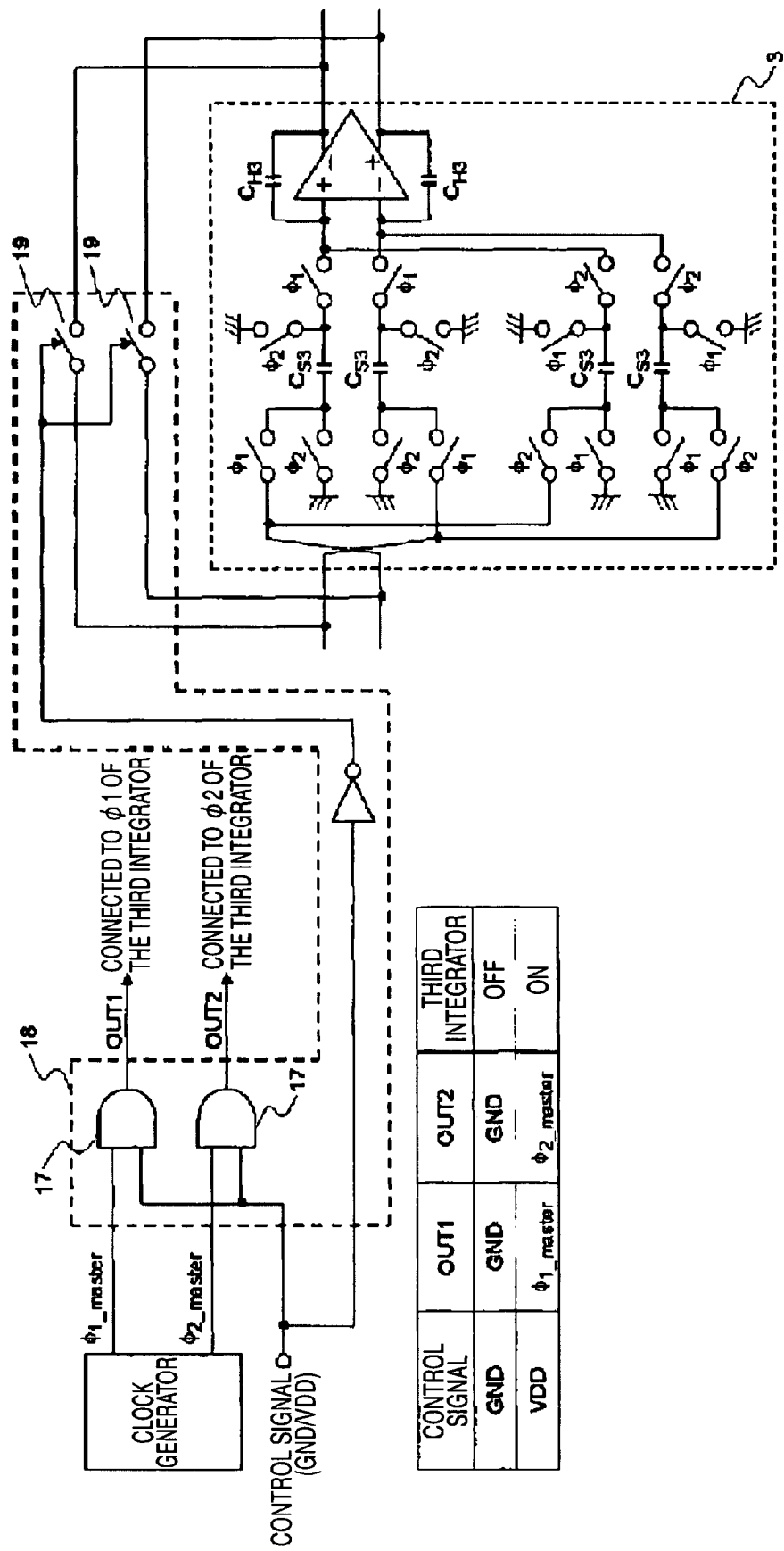
FIG. 7 is a view showing concretely a means for controlling ON/OFF of a third integrator according to the third embodiment of the present invention.

FIG. 7 shows concretely a means for controlling ON/OFF of the third integrator (3) according to the third embodiment of the present invention. In FIG. 7, a means (18) for controlling ON/OFF of the third integrator (3) according to the third embodiment of the present invention has two AND gates (17), and the OUT1 terminal is connected to φ1 of the third integrator (3) and the OUT2 terminal is connected to φ2 of the third integrator (3).

In FIG. 7, either the ground potential (GND) or the power supply voltage (VDD) is applied to a control signal terminal. When the ground potential (GND) is applied, both the OUT1 terminal and the OUT2 terminal are set to a ground potential (GND). Therefore, a switched capacitor of the third integrator (3) is turned OFF and simultaneously a switch (19) between the input and the output of the third integrator (3) is turned ON. Thus, the input and the output of the third integrator (3) are short-circuited. That is, the third integrator (3) is brought into its OFF state. Conversely, when the power supply voltage (VDD) is applied, the output φ1_master of the clock generator is output to the OUT1 terminal and also the output φ2_master of the clock generator is output to the OUT2 terminal, and the switch (19) is turned OFF. Thus, the input and the output of the third integrator (3) are opened. That is, the third integrator (3) is brought into its ON state.

Figure 8:
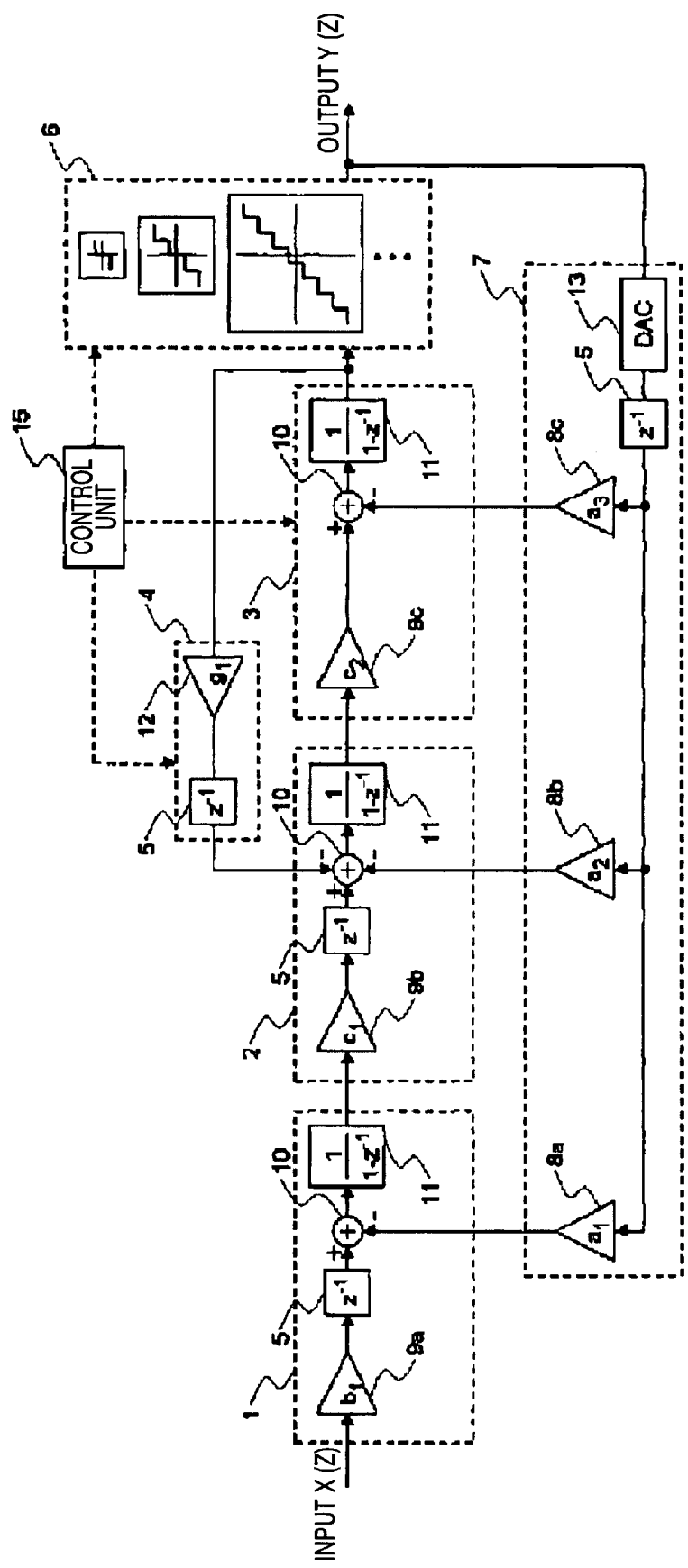
FIG. 8 is a block diagram of a delta-sigma modulator according to a fourth embodiment of the present invention.

FIG. 8 is a block diagram of a delta-sigma modulator according to a fourth embodiment of the present invention. In FIG. 8, the delta-sigma modulator according to the fourth embodiment of the present invention has the control unit (15) for switching the number of bits of the quantizer (6), in addition to the configuration of the delta-sigma modulator according to the third embodiment of the present invention. Normally, a consumption power and a stability of the delta-sigma modulator depend upon the number of bits of the quantizer. Therefore, the optimum number of bits is present in response to the signal band. According to the delta-sigma modulator shown in FIG. 8, the number of bits being quite suitable for the signal band can be selected by switching the number of bits of the quantizer (6). Thus, the delta-sigma modulator can deal with a plurality of signal bands.

Figure 9:
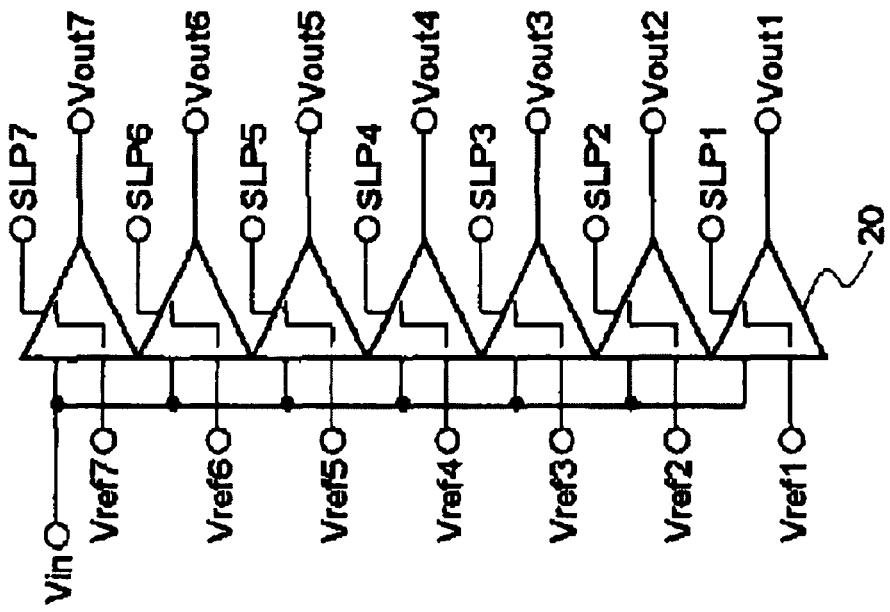
FIG. 9 is a view showing concretely a means for switching the number of bits of a quantizer according to the fourth embodiment of the present invention.

FIG. 9 shows concretely a means for switching the number of bits of the quantizer according to the fourth embodiment of the present invention. By way of example, the case where the number of bits is switched in a range of 1 bit to 3 bits will be discussed. In FIG. 9, the means for switching the number of bits of the quantizer according to the fourth embodiment of the present invention has seven 1-bit quantizers (20). When an SLP terminal of the quantizer is "0", the quantizer is brought into its ON state. On the contrary, when the SLP terminal is "1", the quantizer is brought into its OFF state.

In FIG. 9, SLP1 to SLP7 are control signals to switch the number of bits, either "0" or "1" is applied. When the number of bits is set to 1, SLP 7 is set to "1", SLP 6 is set to "1", SLP 5 is set to "1", SLP 4 is set to "0", SLP 3 is set to "1", SLP 2 is set to "1", and SLP 1 is set to "1", and as a result only the quantizer at a center of a full scale is brought into its ON state. Therefore, the number of bits of 1 is obtained. Similarly, when the number of bits is set to 2, SLP 7 is set to "1", SLP 6 is set to "0", SLP 5 is set to "1", SLP 4 is set to "0", SLP 3 is set to "1", SLP 2 is set to "0", and SLP 1 is set to "1". Similarly, when the number of bits is set to 3, SLP 7 is set to "0", SLP 6 is set to "0", SLP 5 is set to "0", SLP 4 is set to "0", SLP 3 is set to "0", SLP 2 is set to "0", and SLP 1 is set to "0". In the above example, the number of bits is set to three bits. But the number of bits can be switched in the same way as the above even though the number of bits is set to four bits or more.

The present invention is useful for the delta-sigma modulator used in the radio communication field, the audio field, and others.

What is claimed is:

1. A delta-sigma modulator including integrators cascade-connected at a plurality of stages, a quantizer for quantizing an output signal of the integrator at a last stage, a DA converter for returning an output signal of the quantizer to inputs of the integrators at a plurality of stages, and a local feedback unit that contains two integrators or more out of the integrators at the plurality of stages and needs no interposition of the quantizer, comprising:
    a first delay unit for delaying output signals of the DA converter by a half period of a clock; and
    a second delay unit for delaying an output signal of the local feedback unit by the half period of the clock;
    wherein the delta-sigma modulator operates at timings of a double sampling;
    the integrators at a plurality of stages are constructed by cascade-connecting first to third integrators,
    the first integrator includes a third delay unit for delaying the input signal by the half period of the clock, and a first adder for subtracting the output signals of the DA converter from an output signal of the third delay unit,
    the second integrator includes a fourth delay unit for delaying an output signal of the first integrator by the half period of the clock, and a second adder for subtracting the output signals of the DA converter and an output signal of the local feedback unit from an output signal of the fourth delay unit, and
    the third integrator includes a third adder for subtracting the output signals of the DA converter from an output signal of the second integrator.

2. The delta-sigma modulator according to claim 1, further comprising:
    a controlling unit for turning ON/OFF a function of the third integrator.

3. The delta-sigma modulator according to claim 1, further comprising:
    a controlling unit for turning ON/OFF a function of the local feedback unit.

4. The delta-sigma modulator according to claim 3, further comprising:
    a controlling unit for switching a number of bits of the quantizer.

* * * * *